United States Patent
Engel et al.

(10) Patent No.: US 6,539,625 B2
(45) Date of Patent: Apr. 1, 2003

(54) CHROMIUM ADHESION LAYER FOR COPPER VIAS IN LOW-K TECHNOLOGY

(75) Inventors: Brett H. Engel, Fishkill, NY (US); Mark Hoinkis, Fishkill, NY (US); John A. Miller, Newburgh, NY (US); Soon-Cheon Seo, White Plains, NY (US); Yun-Yu Wang, Poughquag, NY (US); Kwong Hon Wong, Wappingers Falls, NY (US)

(73) Assignees: International Business Machines Corporation, Armonk, NY (US); Infineon Technologies AG, Munich (DE)

( * ) Notice: Subject to any disclaimer, the term of this patent is extended or adjusted under 35 U.S.C. 154(b) by 98 days.

(21) Appl. No.: 09/759,017

(22) Filed: Jan. 11, 2001

(65) Prior Publication Data

US 2002/0088117 A1 Jul. 11, 2002

(51) Int. Cl.$^7$ ................................................ H05K 3/02
(52) U.S. Cl. .............................. 29/846; 29/847; 29/852; 29/830; 29/831
(58) Field of Search ......................... 29/846, 847, 852, 29/831, 830

(56) References Cited

U.S. PATENT DOCUMENTS

| | | | | |
|---|---|---|---|---|
| 4,396,900 A | | 8/1983 | Hall | 338/309 |
| 5,153,986 A | | 10/1992 | Brauer et al. | 29/846 |
| 5,503,286 A | | 4/1996 | Nye, III et al. | 216/13 |
| 6,228,511 B1 | * | 5/2001 | Sachdev et al. | 174/261 |
| 6,245,655 B1 | * | 6/2001 | Moslehi | 438/612 |
| 6,263,566 B1 | * | 7/2001 | Hembree et al. | 29/846 |
| 6,274,823 B1 | * | 8/2001 | Khandros et al. | 174/260 |
| 6,336,269 B1 | * | 1/2002 | Eldridge et al. | 228/180.5 |
| 6,370,768 B1 | * | 4/2002 | Itabashi | 205/126 |

* cited by examiner

Primary Examiner—Joseph J. Hail, III
Assistant Examiner—Alvin J Grant
(74) Attorney, Agent, or Firm—Ira D. Blecker

(57) ABSTRACT

In integrated circuits having copper interconnect and low-k interlayer dielectrics, a problem of open circuits after heat treatment was discovered and solved by the use of a first liner layer of Cr, followed by a conformal liner layer of CVD TiN, followed in turn by a final liner layer of Ta or TaN, thus improving adhesion between the via and the underlying copper layer while maintaining low resistance.

9 Claims, 2 Drawing Sheets

CHROMIUM ADHESION LAYER FOR COPPER VIAS IN LOW-K TECHNOLOGY

FIELD OF THE INVENTION

The field of the invention is that of forming integrated circuits with copper metallization and low-k dielectrics.

BACKGROUND OF THE INVENTION

In the field of copper with oxide, the art has developed a set of compatible materials to line the trenches and vias that contain the copper. The lining must adhere to the dielectric and block diffusion and electromigration.

Conventionally, in oxide dielectric circuits, a dual damascene structure combining a via connected to a lower level with a horizontal interconnection member includes an adhesion layer of Ta or TaN, a barrier layer of TaN to prevent diffusion of the copper and a top layer of Ta or TaN prior to Cu seed deposition.

As the dimension of semiconductor devices continues to shrink, the RC delay of its metal interconnects becomes a major limiting factor of the device speed. In order to resolve this issue, implementation of interconnects (which reduces resistance, R) in a low-k dielectric material (which reduces capacitance, C, between the metal lines) becomes a key issue for the semiconductor industry to shrink the device to deep sub-micrometer dimension.

The most economical way to implement Cu low-k metallization process is to use a dual-damascene structure with metal via and metal lines being etched and filled with Cu metal in one process step. The excess Cu is removed by CMP (chemical mechanical polishing). In a dual-damascene structure, a barrier layer (or multiple layers) between the Cu metal and the dielectric material is required for both metal vias and metal lines. This barrier layer is known as a liner. The liner has two functions: as a Cu diffusion barrier to prevent Cu from diffusing into the dielectric material and as a contact layer between Cu metal via and underlying metal line (which can be made of Cu or W).

In the field of Cu dual-damascene metallization structures in SiO2 dielectric (which is not considered as low-k dielectric material), the prior art has developed a set of compatible materials for the liner, such as Ta, TaN, and CVD TiN. It has been discovered that Ta has good adhesion with Cu metal and CVD TiN has better coverage on the sidewall of the line and via, especially for high aspect ratio structures.

However, in the field of forming Cu metal interconnects in low-k dielectric material, new problems have arisen that do not have a counterpart in the Cu metal interconnects in SiO2 dielectric. For instance, one of the low-k dielectric such as SiLK has several material properties that do not exist in SiO2. SiLK is polymer material, and is largely made of C. SiLK is also a soft material with a very high thermal expansion coefficient. Because of these unique properties of SiLK material, the requirements for Cu metal interconnects in that material, such as coverage of the sidewall of via and adhesion between liner and underlying metal (Cu or W metal), is different from corresponding requirements in Cu metallization in SiO2 dielectric material.

In addition, the fact that the dimensions of vias and metal lines are decreasing, with a corresponding increase in the aspect ratio of vias, adds additional requirements on the liner for a dual-damascene structure.

SUMMARY OF THE INVENTION

The invention relates to a combination of materials and structure for copper interconnect circuits using low-k dielectrics that provide the required adhesion between the bottom of a via and the lower copper interconnection member, together with adequately low resistance.

A feature of the invention is that the adhesion between the Cr liner layer at the bottom of a via and the underlying interconnect is sufficient to withstand the stress caused by thermal cycling.

Another feature of the invention is that carbon contamination on the bottom of a via is reduced by the gettering action of a layer of Cr.

DESCRIPTION OF THE PREFERRED EMBODIMENT

In testing integrated circuits combining copper metallization with low-k dielectric (e.g. SiLK from Dow) an unexpected problem was identified.

In contrast to the prior art work in copper interconnects with oxide interlayer dielectric, an unacceptably high failure rate of open vias after thermal cycling occurred.

The cause of the problem was identified as mechanical separation between the bottom of the vias and the underlying copper members.

This problem can only increase as the transverse dimensions of vias shrink (and their aspect ratio increases).

Figure 2:
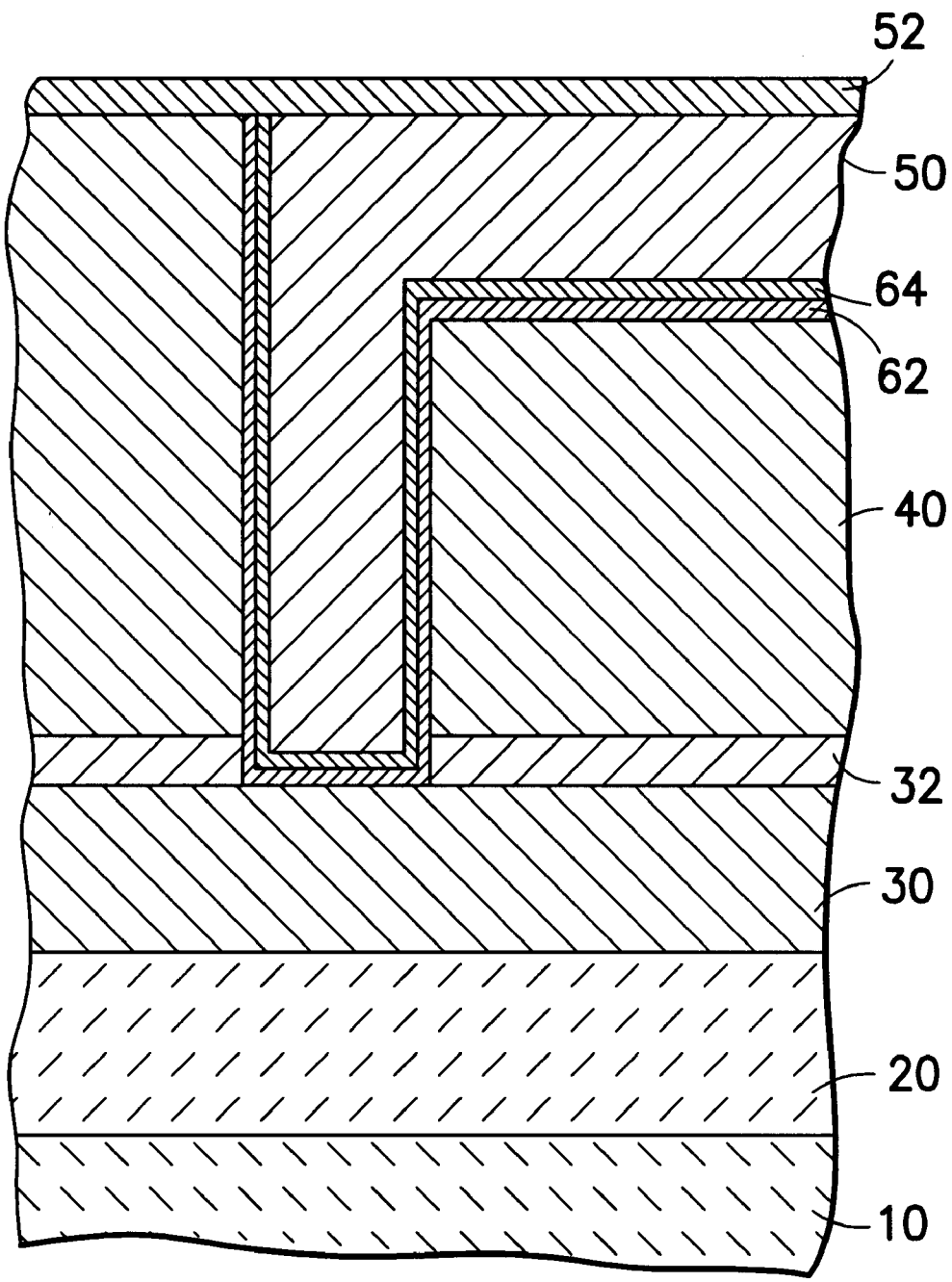
FIG. 2 shows a portion of interconnect according to the prior art.

Referring now to FIG. 2, there is shown a typical via according to the prior art. Lower dielectric layer 20 is disposed on a silicon substrate 10. A first copper layer 30 extends from left to right. A conventional barrier layer 32, referred to as a capping layer, e.g. SiN, has been deposited on copper layer 30.

In the center of the Figure, a via extends down from copper layer 50 to make contact with layer 30. The copper is lined with a conventional combination of a CVD TiN liner 62 and a Ta (and/or TaN) liner 64. In an illustrative embodiment, for a process having a nominal ground rule of 200 nm, the thickness of layer 40 is nominally 300 nm, the dimensions of the via are nominally 200 nm by 200 nm and the aspect ratio is nominally 3.5. As dimensions shrink, the aspect ratio (and thus the strain on the bond at the bottom of the via) will increase.

It has been found that this combination, while satisfactory before any heat stress, results in an unacceptably high failure rate after repeated thermal cycles between −65° C. and 200° C. The cause of this failure rate has been identified as mechanical separation at the bottom of the via. The thermal expansion coefficient of SiLK is five times greater than that of copper, so that the interlayer dielectric exerts great stress on the joint at the bottom of the via when the circuit temperature rises.

One suspect cause of this separation is that carbon is emitted (outgassed) from the low-k dielectric during the previous steps of etching and cleaning the via. This carbon is not entirely removed by conventional cleaning processes such as sputter cleaning and interferes with the formation of a good bond between the top surface of the copper and the bottom surface of the liner. In addition, oxygen can be adsorbed on the exposed bottom of the via when the wafer is exposed to air. The combination of these effects weakens the bond between the Ta and/or TaN and the copper and gives rise to the phenomenon of creating open circuits under thermal stress. This has created a difficult problem in combining the beneficial features of copper interconnect and low-k dielectric.

Figure 1:
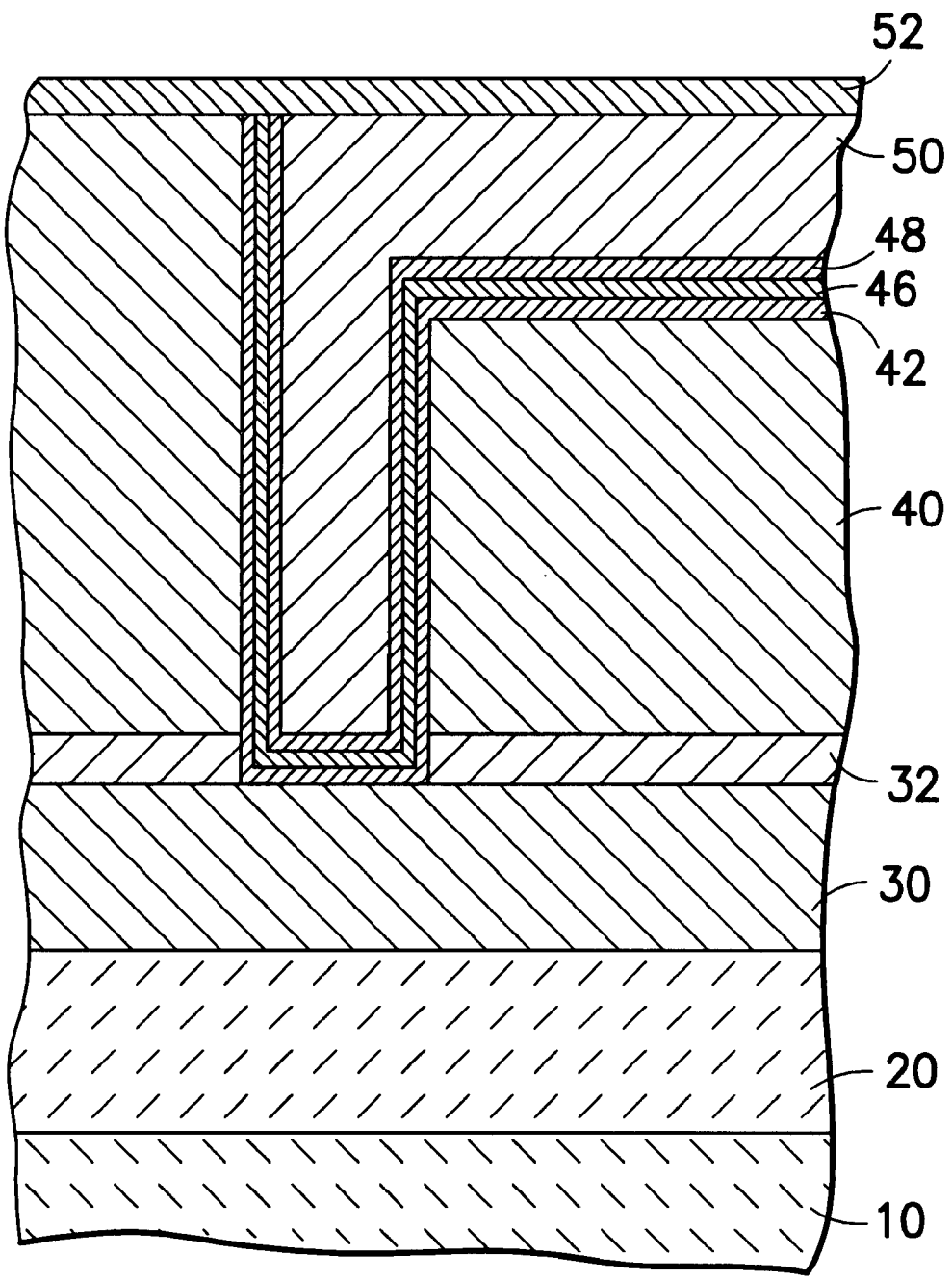
FIG. 1 shows a portion of interconnect according to the invention.

Referring now to FIG. 1, there is shown an embodiment of the invention, in which the liners 62 and 64 have been replaced with a first liner 42 of sputtered Cr, nominally 10–20 nm thick at the bottom of the via. Coverage of Cr on the sides will be less than at the bottom, as sputtered Cr does not cover vertical surfaces well. It has been found that Cr adheres well to organic materials, such as SiLK. Cr has been used as an adhesion layer on copper in the past in the field of integrated circuit packaging, where organic materials are not used and where the dimensions and stresses are totally different from those in the integrated circuit arts.

Next, a CVD TiN (deposited by chemical vapor deposition) liner 46, nominally 5 nm–10 nm thick, has been deposited in standard conditions. This layer is conformal and compensates for the lack of coverage of the first layer. The TiN also adheres well to the SiLK, so that if there are any open SiLK surfaces on the walls of the via, there will still be good adhesion on the walls.

The final layer of the liner is a Ta layer 48, nominally 25 nm thick, that serves to improve the bonding between the TiN liner and the Cu interconnect member. TaN may also be used.

Experimental results suggest that vias constructed according to the invention have reduced the failure rate dramatically. In operation, the first layer of copper interconnect is deposited and patterned as usual (preferably in a damascene structure). The first layer of dielectric is also deposited as usual. Next, a set of vias is etched through the interlayer dielectric, preferably in a dual-damascene process. A set of three liner layers is put down and, if preferred, removed outside the channels for the second layer of copper by conventional CMP.

The second layer of copper is put down and patterned. The process is repeated as often as required until all the layers of copper are put down.

Alternative Embodiments

The preceding discussion has referred to a three-layer liner. Other embodiments of the invention can also be used. For example, a single Cr layer 42 can be used, without the TiN or Ta. This embodiment forgoes the conformal coverage of the TiN and its qualities as a diffusion barrier. This embodiment has the advantage of less cost, but is less conformal than the CVD TiN.

Another embodiment is the replacement of Ta top liner layer 48 by another sputtered layer of Cr. This provides good adhesion to the upper copper layer of interconnect and uses less material.

Yet another layer dispenses with the TiN layer 46 and retains the Ta (or TaN) layer 48. This will be less conformal than the first embodiment, but dispenses with the CVD step.

In each embodiment, there will ordinarily be a conventional sputtered copper seed layer to promote adhesion.

While the invention has been described in terms of a single preferred embodiment, those skilled in the art will recognize that the invention can be practiced in various versions within the spirit and scope of the following claims.

We claim:

1. A method of forming copper interconnections in an integrated circuit comprising the steps of:
    (a) depositing and patterning a first layer of copper interconnect;
    (b) depositing a first layer of low dielectric constant interlayer dielectric;
    (c) forming a set of vias through said first layer of low dielectric constant interlayer dielectric, stopping on said first layer of copper interconnect, each of said vias having a wall and a bottom;
    (d) depositing a first liner layer of Cr within said set of vias, said liner layer lining the entire wall and bottom of each via of said set of vias; and
    (e) depositing and patterning a second layer of copper interconnect.

2. A method of forming copper interconnections in an integrated circuit according to claim 1, comprising the additional step of:
    (d-1) depositing a second liner layer of CVD TiN in said set of vias.

3. A method of forming copper interconnections in an integrated circuit according to claim 2, comprising the additional step of:
    (d-2) depositing a third liner layer selected from the group consisting of Ta and TaN.

4. A method of forming copper interconnections in an integrated circuit according to claim 2, comprising the additional step of:
    (d-2) depositing a third liner layer of Cr.

5. A method of forming copper interconnections in an integrated circuit according to claim 1, comprising the additional step of:
    (d-1) depositing a second liner layer selected from the group consisting of Ta and TaN.

6. A method of forming copper interconnections in an integrated circuit comprising the steps of:
    (a) depositing and patterning a first layer of copper interconnect;
    (b) depositing a first layer of low dielectric constant interlayer dielectric;
    (c) forming a set of vias through said first layer of low dielectric constant interlayer dielectric, stopping on said first layer of copper interconnect;
    (d) depositing a first liner layer of Cr within said set of vias;
    (e) depositing a second liner layer of CVD TiN in said set of vias;
    (f) depositing a third liner layer selected from the group consisting of Ta and TaN; and
    (g) depositing and patterning a second layer of copper interconnect.

7. A method according to claim 6, further including repeating said steps (b) through (g) at least once.

8. A method according to claim 6, in which said low dielectric constant interlayer dielectric comprises SiLK.

9. A method according to claim 7, in which said low dielectric constant interlayer dielectric comprises SiLK.

* * * * *